(12) United States Patent
Park et al.

(10) Patent No.: US 7,520,998 B2
(45) Date of Patent: Apr. 21, 2009

(54) METHOD OF FABRICATING MICRO ACTUATOR HAVING MEDIA STAGE

(75) Inventors: Hong-sik Park, Seoul (KR);
Seung-bum Hong, Seongnam-si (KR);
Jong-youp Shim, Incheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 7 days.

(21) Appl. No.: 11/595,876

(22) Filed: Nov. 13, 2006

(65) Prior Publication Data
US 2007/0137780 A1    Jun. 21, 2007

(30) Foreign Application Priority Data
Dec. 20, 2005    (KR) .................. 10-2005-0126099

(51) Int. Cl.
*C23F 1/00*    (2006.01)
(52) U.S. Cl. ........................................... 216/2
(58) Field of Classification Search ............... 216/2, 216/22; 310/12, 40 MM; 438/50, 52, 53, 438/694
See application file for complete search history.

(56) References Cited

U.S. PATENT DOCUMENTS 5,698,783 A * 12/1997 Murakoshi et al. ....... 73/504.03
2005/0040730 A1    2/2005 Baeck et al.

FOREIGN PATENT DOCUMENTS

KR    10-2005-0020872 A    3/2005

* cited by examiner

*Primary Examiner*—Roberts P Culbert
(74) *Attorney, Agent, or Firm*—Sughrue Mion, PLLC

(57) ABSTRACT

A method of fabricating a micro actuator is provided including a media stage having a media loading surface and a coil for driving the media stage, formed on the opposite surface of the media stage to the media loading surface. The method includes forming a groove on a first surface of a first substrate, forming a coil on a first surface of a second substrate, bonding the first surface of the first substrate to the first surface of the second substrate, and forming the media loading surface on a second surface of the second substrate, which is opposite the first surface of the second substrate.

13 Claims, 10 Drawing Sheets

METHOD OF FABRICATING MICRO ACTUATOR HAVING MEDIA STAGE

CROSS-REFERENCE TO RELATED PATENT APPLICATION

This application claims priority from Korean Patent Application No. 10-2005-0126099, filed on Dec. 20, 2005, in the Korean Intellectual Property Office, the disclosure of which is incorporated herein in its entirety by reference.

BACKGROUND OF THE INVENTION

1. Field of the Invention

The present invention relates to a method of fabricating an electromagnetic micro actuator used in a data storage system employing a scanning probe microscopy (SPM) technology, and more particularly, to a method of fabricating a micro actuator that can increase the storage capacity of a data storage system by improving an area efficiency of a media stage.

2. Description of the Related Art

Generally, a typical data storage system employing SPM technology includes a data storage medium mounted on a media stage, a driving unit for driving the data storage medium in X and Y-axes, one or more probes each having a tip for reading and writing data from and to the data storage medium, and a signal process unit for processing data signals.

In order to drive the data storage medium in the X and Y-axes, an electrostatic micro actuator or an electromagnetic micro actuator are generally used. The former uses an electrostatic force generated between a driving electrode and a stationary electrode. The latter uses the Lorenz force generated by an interaction between coils mounted on the media stage and permanent magnets mounted above and below the coil.

In the electrostatic micro actuator, since the media stage and the driving unit are located on an identical plane, the usable area of the stage relative to the overall size of the micro actuator is low. This reduces the data storage capacity.

In the electromagnetic micro actuator, the coils are formed on the media stage, and thus the data storage medium can be located only in the area where the coils are not formed, which reduces the usable area relative to the overall size of the media stage. Furthermore, since the electromagnetic micro actuator has a relatively wide displacement range, a large current is required. This can cause power loss.

SUMMARY OF THE INVENTION

An aspect of the present invention provides a method of fabricating a micro actuator that can increase an area efficiency and reduce power loss.

According to an aspect of the present invention, there is provided a method of fabricating a micro actuator including a media stage having a media loading surface and a coil for driving the media stage, the coil being formed on the opposite surface of the media stage to the media loading surface, the method including: forming a groove on a first surface of a first substrate; forming a coil on a first surface of a second substrate; bonding the first surface of the first substrate to the first surface of the second substrate; and forming the media loading surface on a second surface of the second substrate, which is opposite the first surface of the second substrate.

According to another aspect of the present invention, there is provided a method of fabricating a micro actuator including a media stage having a media loading surface and a coil for driving the media stage, the coil being formed on the opposite surface of the media stage to the media loading surface, the method including: forming a groove and a first electrode on a first surface of a glass substrate; forming a coil and a second electrode on a first surface of a silicon substrate; anodic-bonding the first surface of the glass substrate to the first surface of the silicon substrate such that the first and second electrodes contact each other to form an electrode pad for applying an electric current; and forming the media loading surface on a second surface of the silicon substrate, which is opposite the first surface of the silicon substrate, by etching the second surface to a depth within a range where the coil is not exposed.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF EXEMPLARY EMBODIMENTS OF THE INVENTION

Various aspects of the present invention will now be described more fully with reference to the accompanying drawings, in which exemplary embodiments of the invention are shown.

Figure 1:
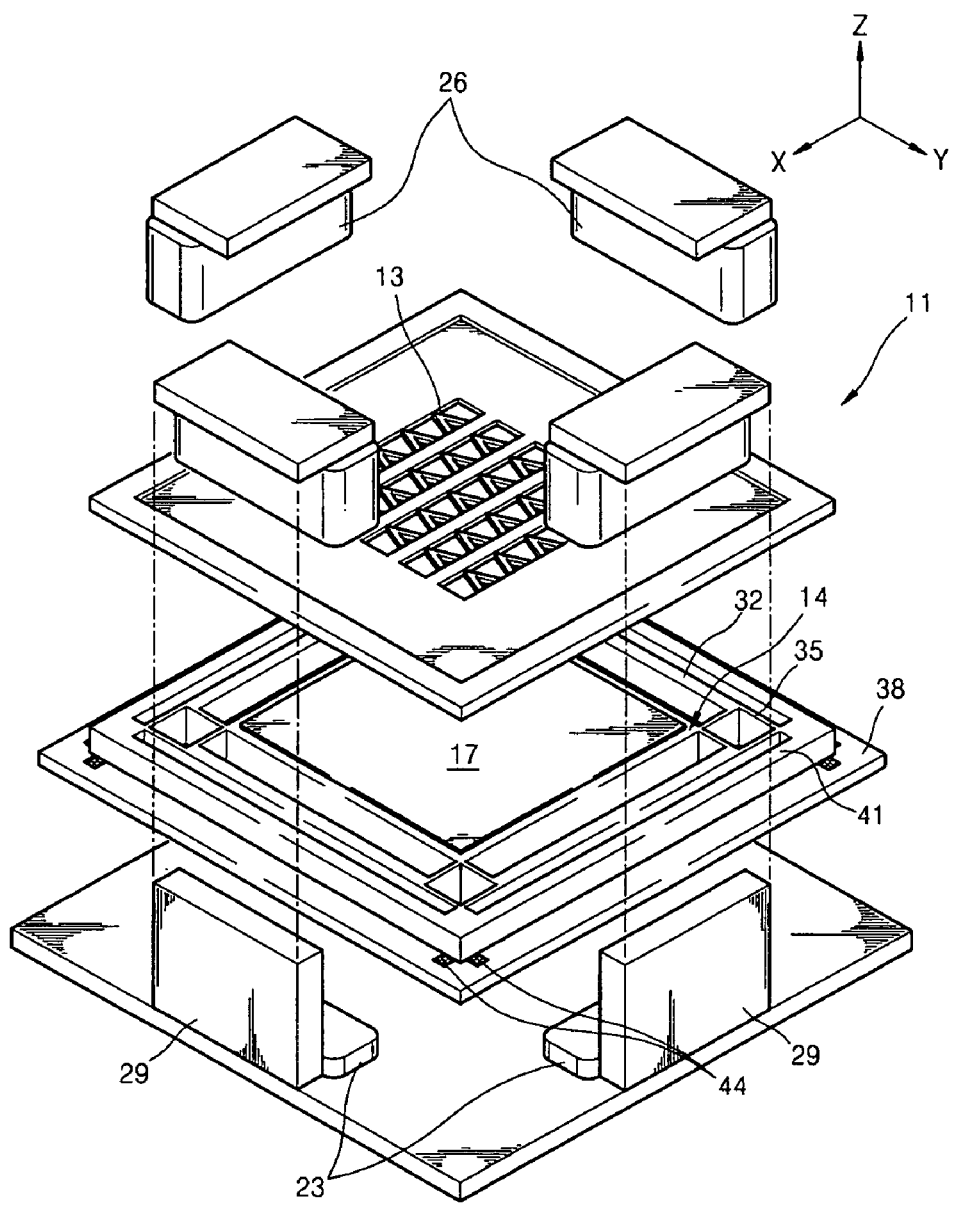
FIG. 1 is an exploded perspective view of a micro actuator fabricated by a method according to an exemplary embodiment of the present invention.
Figure 2A:
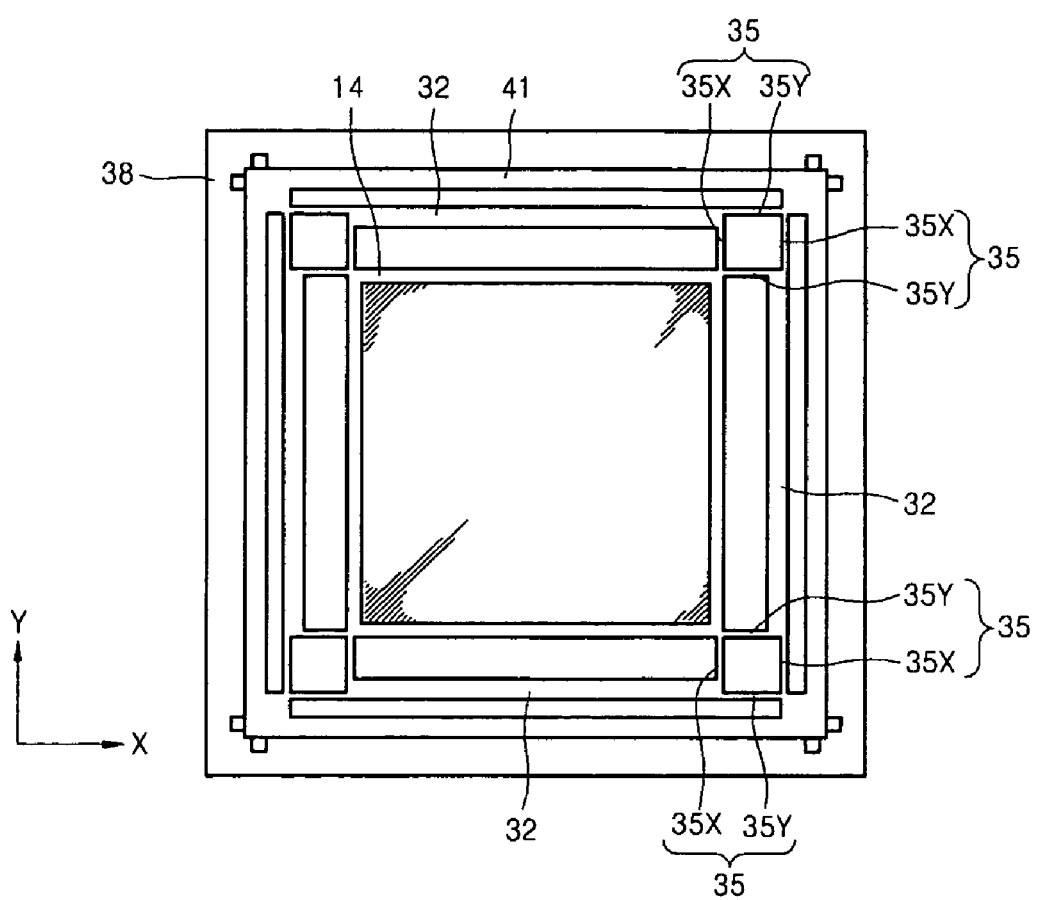
FIG. 2A is a top view of a media stage depicted in FIG. 1.

FIG. 1 is an exploded perspective view of a micro actuator fabricated by a method according to an exemplary embodiment of the present invention and FIG. 2A is a top view of a media stage depicted in FIG. 1.

Referring to FIGS. 1 and 2, a micro actuator 11 includes a cantilever 13, a data storage medium 17, a media stage 14 on which the data storage medium 17 is mounted, a stage base 38 for supporting the media stage 14, four pairs of permanent magnets 23 and 26 located above and below the media stage 14, yokes 29 for forming/directing the magnetic field of the permanent magnets 23 and 26, a plurality of stiffeners 32 which prevent a rotation of the media stage 14, and a plurality of elastic beams 35. Coils for driving the media stage 14 are located on the bottom surface of the media stage 14, and thus are not shown in FIG. 1.

The elastic beams 35 are located on four corners of the media stage 14, and the media stage 14 moves along X or Y-axis according to a driving principal that will be described later. Each of the elastic beams 35 includes a first elastic beam section 35X for supporting an elastic force in the direction of the X axis, and a second elastic beam section 35Y for supporting an elastic force in the direction of the Y-axis. The elastic beams 35 are elastically deformed by the movement of the media stage 14.

The stiffeners 32 surround the media stage 14, and are spaced apart from and located in parallel with the respective sides of the media stage 14. Opposite ends of each stiffener 32 are connected to the first and second beam sections 35X and 35Y of each elastic beam 35 to prevent the media stage 14 from rotating in a direction other than the directions of the X and Y-axes.

The data storage medium 17 is loaded on the media stage 14. The media stage 14 is formed of silicon and lifted from the stage base 38 by supporting beams 41 each having a bottom surface contacting the stage base 38.

Figure 2B:
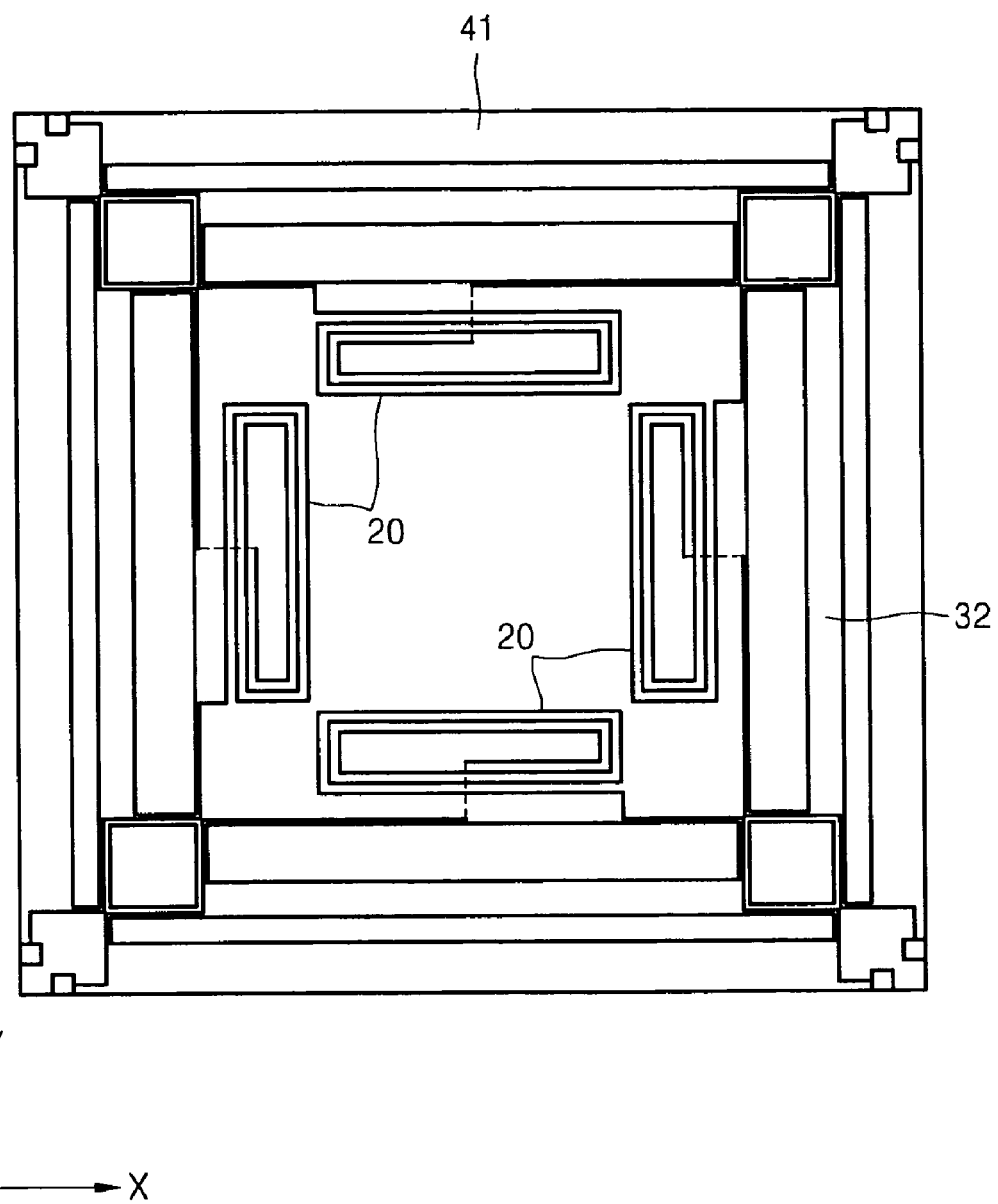
FIG. 2B is a bottom view of a media stage depicted in FIG. 1.

FIG. 2B is a bottom view of the media stage depicted in FIG. 1.

Referring to FIG. 2B, the coils 20 are formed on four side edges of the bottom surface of the media stage 14. A plurality of electrode pads 44 extend respectively from the coils 20 to the four corners of the stage base 38 contacting the media stage 14.

Therefore, the coils 20 are not exposed to the top surface of the media stage 14, thereby increasing the area of the media stage 14 where the medium 17 can be loaded.

Figure 3:
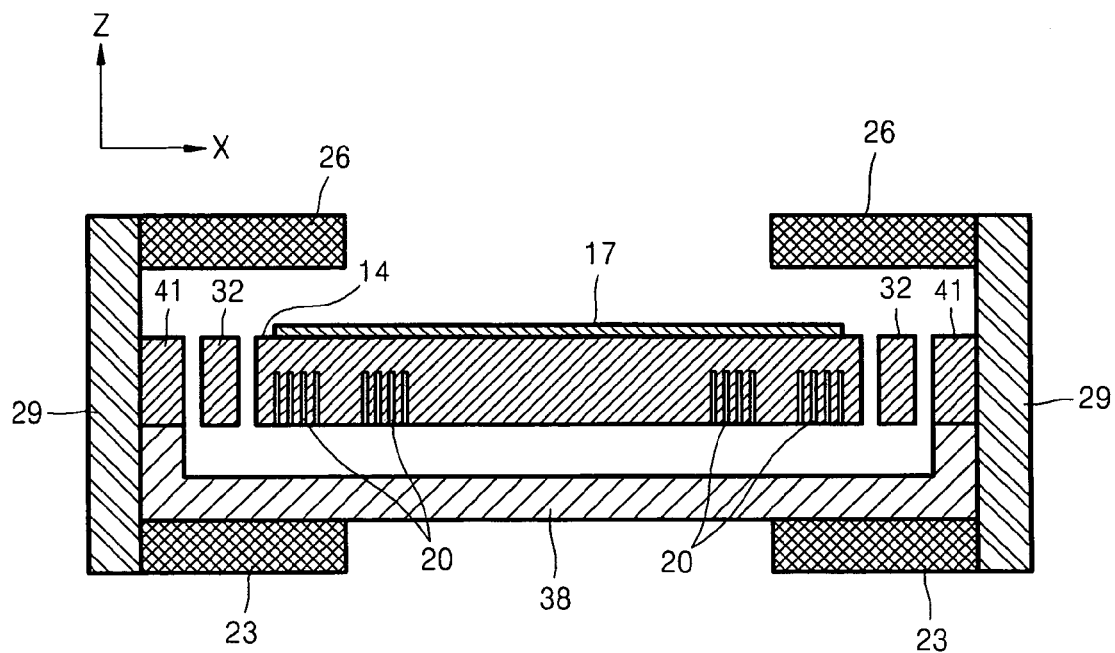
FIG. 3 is a sectional view of the micro actuator depicted in FIG. 1.
Figure 4:
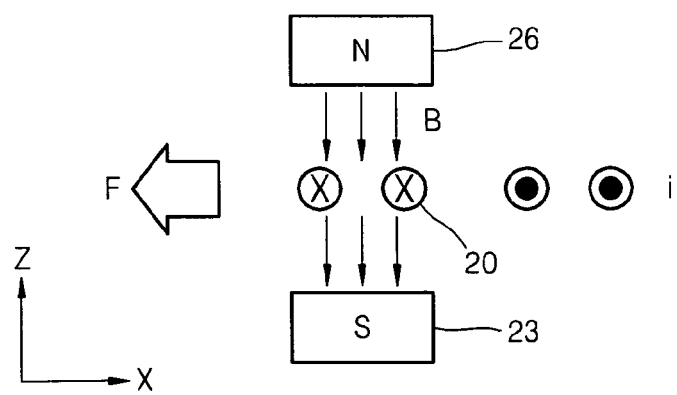
FIG. 4 is a schematic view of the driving principal of the media stage depicted in FIG. 1.

FIG. 3 is a sectional view of the micro actuator depicted in FIG. 1, and FIG. 4 is a schematic view of the driving principle of the media stage depicted in FIG. 1.

Referring to FIGS. 3 and 4, the permanent magnets are located such that a magnetic field is formed across half of each coil 20. When an electric current i is applied to the coils 20, the magnetic field B is formed in the thickness direction of the media stage 14, and the Lorenz force F is generated orthogonal to the current i and magnetic field B. Then, the media stage 14 holding the data storage medium 17 is moved in the directions of the X or Y-axis by the Lorenz force F. When current is simultaneously applied to another pair of opposing coils 20, the driving force on the media stage 14 can be doubled. Alternatively, the opposing coils can be used to detect the movement of the media stage 14 using an induced electromotive force.

A method of fabricating the micro actuator will now be described with reference to the accompanying drawings.

Figure 5A:
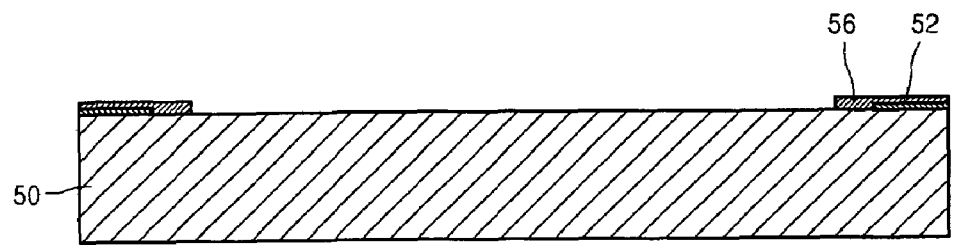
FIGS. 5A through 5C are views illustrating a process for forming electrodes and grooves on a glass substrate.

Referring first to FIG. 5A, a first electrode 52 is formed on a glass substrate 50, and a groove etching mask 56 is formed. The first electrode 52 and the groove etching mask 56 may be formed of Cr and/or Au.

Figure 5B:
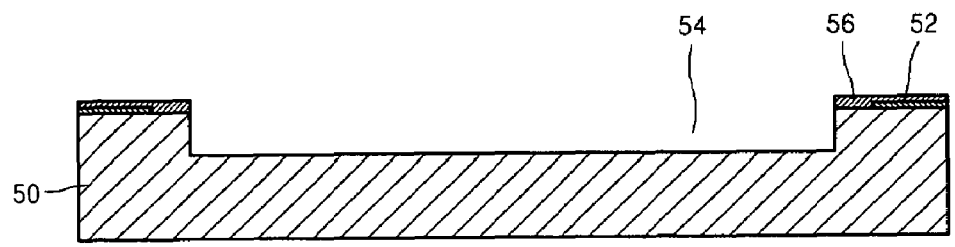

Next, as shown in FIG. 5B, the glass substrate 50 is etched to form a groove 54. HF at a ratio of 3:1 may be used as an etchant.

Figure 5C:
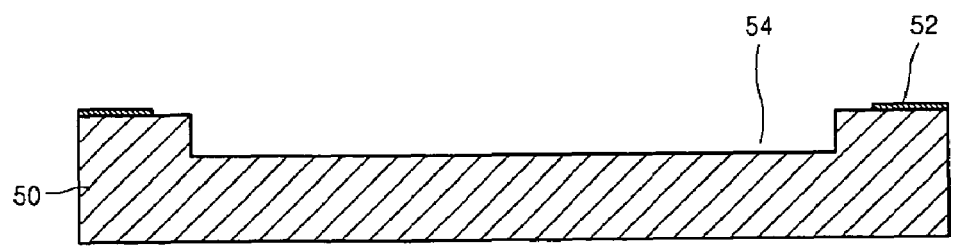

Then, as shown in FIG. 5C, the etching mask 56 is removed to complete the stage base 38 with the groove 54.

FIGS. 6A through 6G are views illustrating a process for forming a coil and a second electrode on a silicon substrate.

The silicon substrate 60 may be formed of a silicon-on-insulator (SOI) substrate including a handle wafer 63, an oxidation layer 66 and a device layer 67.

Figure 6A:
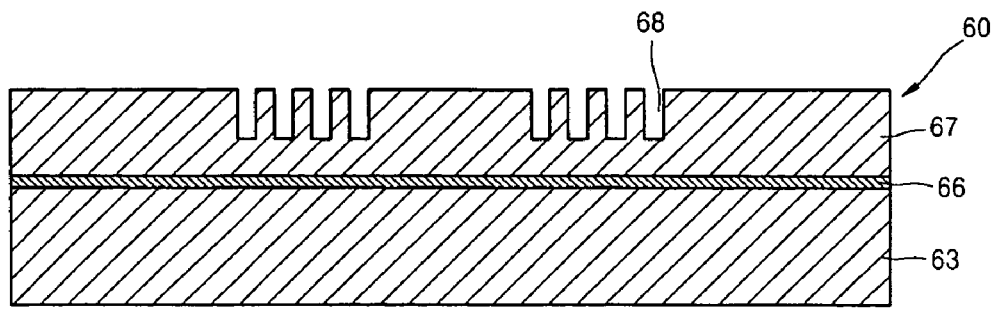
FIGS. 6A through 6G are views illustrating a process for forming coils and electrodes on a silicon substrate.

As shown in FIG. 6A, after forming a mask pattern for a coil 62 on the silicon substrate 60 through a photolithography process, a trench 68 is formed by inductively coupled plasma reactive ion etching (ICP-RIE).

Figure 6B:
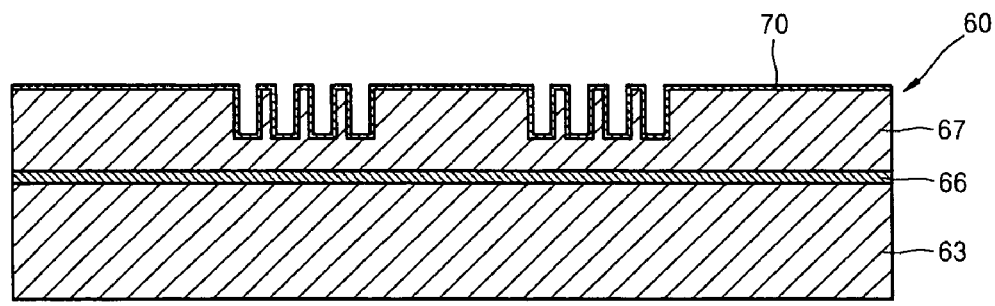

Next, as shown in FIG. 6B, a passivation layer 70 is formed through a thermal oxidation process.

Figure 6C:
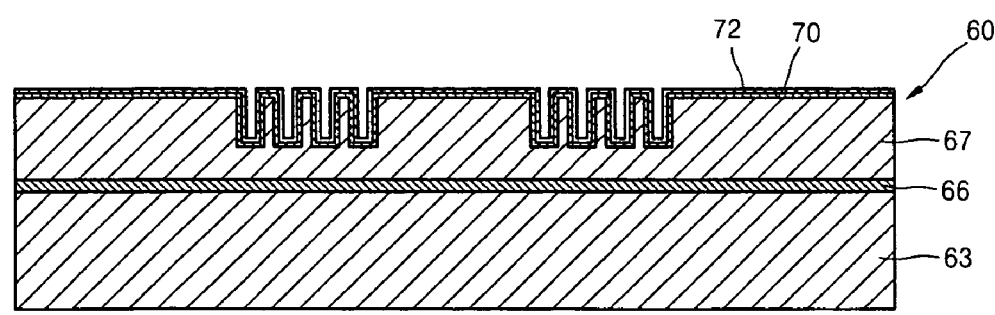
Figure 6D:
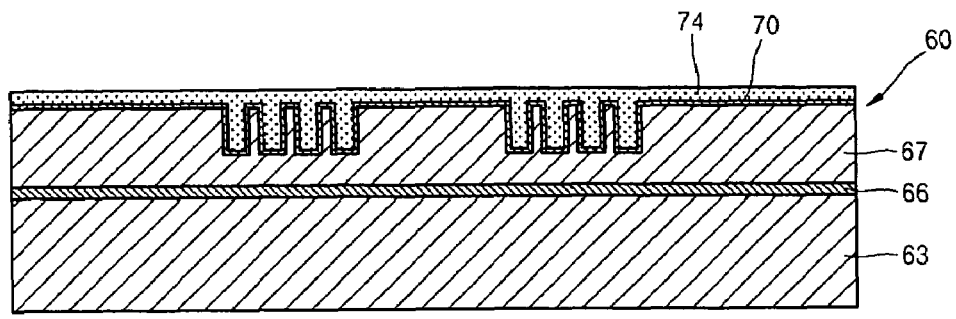

Then, as shown in FIGS. 6C and 6D, metal is filled into the trench 68 by chemical vapor deposition (CVD) or electroplating. For example, when electroplating is used, a seed layer 72 is deposited on the passivation layer 70 using a sputtering device (see FIG. 6C), and a plating layer 74 is formed through electroplating (see FIG. 6D) using the seed layer 72 as a seed for the plating layer 74.

Figure 6E:
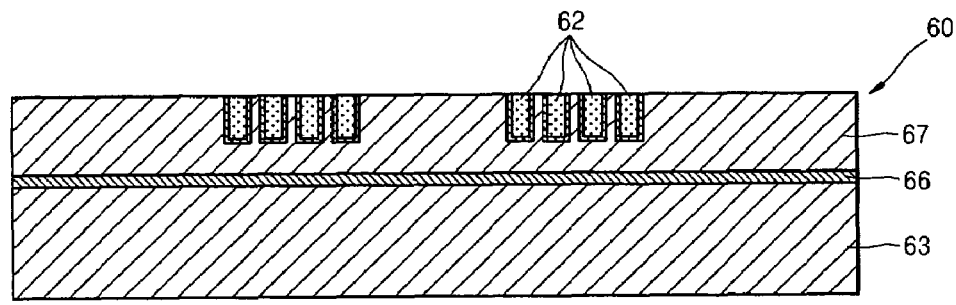

Next, as shown in FIG. 6E, the plating layer 74 exposed above the trench 68 is polished, for example by chemical mechanical polishing (CMP), thereby completing the coil 62.

Figure 6F:
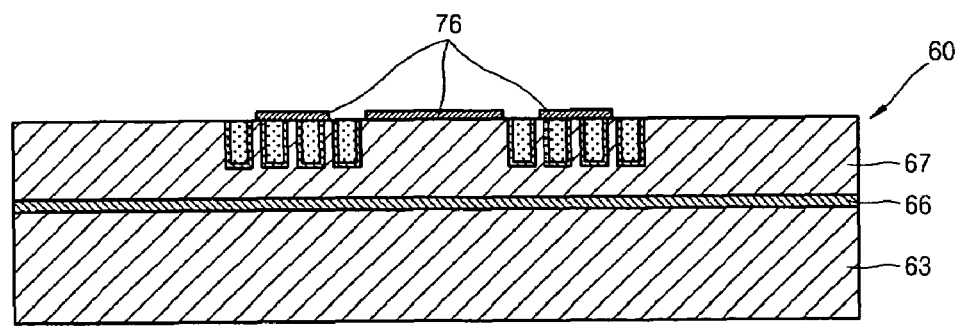
Figure 6G:
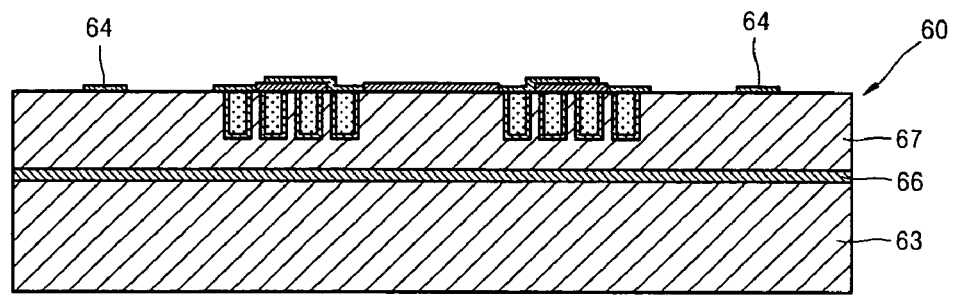

Then, as shown in FIGS. 6F and 6G, the second electrode 64 is formed to apply an electric current to the coil 62. That is, after forming an insulation layer 76 (see FIG. 6F), the second electrode 64 is formed by metal deposition, mask patterning and metal etching.

FIGS. 7A through 7E are views illustrating a process for forming a data storage medium loading surface after the silicon substrate is bonded to the glass substrate.

Figure 7A:
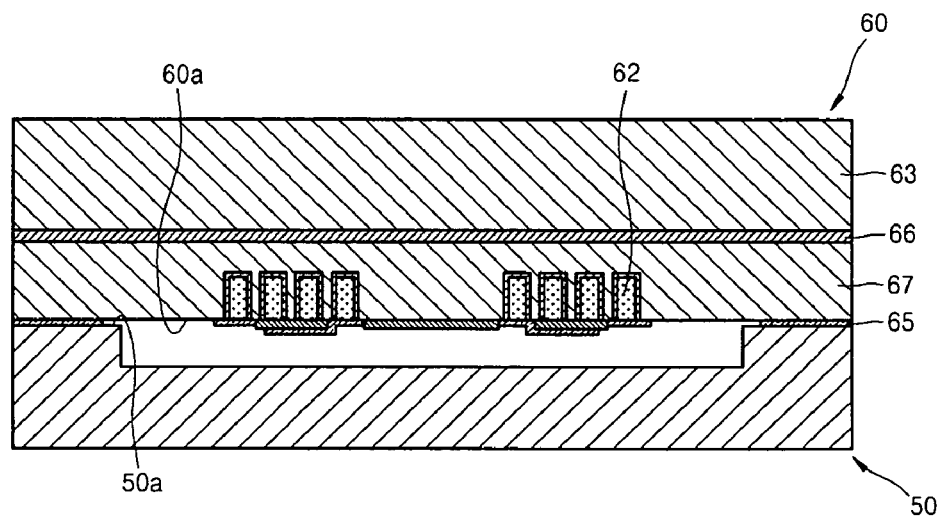
FIGS. 7A through 7E are views illustrating a process for forming a data storage medium loading surface after a silicon substrate is bonded to a glass substrate.

Referring first to FIG. 7A, the top surface 60a of the silicon substrate 60 and the top surface 50a of the glass substrate 50 are bonded to each other such that the first and second electrodes 52 (see FIG. 5c) and 64 (see FIG. 6G) contact each other. Then, the second electrodes 64 connected to the first electrodes 52 are exposed through an etching process that will be described later, to function as an electrode pad 65 for applying the electric current to the coil 62.

The bonding may be an anodic bonding process, employing a field assisted sealing technology. In the anodic bonding process, several hundred volts are applied between the silicon and glass substrates 60 and 50 to make the silicon substrate 60 an anode and the glass substrate 50 a cathode. The temperature is then raised to several hundred degrees (□) so that positive ions of the glass substrate 50 increase in kinetic energy to move to the surface of the glass substrate 50. The negative ions are more strongly bonded to the glass substrate 50 and form a space charge layer near the surface of the silicon substrate 60. As the positive ions in the glass substrate 50 move to the surface of the glass substrate 50, the potential (or voltage) drop at the interface between the glass substrate 50 and the silicon substrate 60 increases, thereby bonding the glass and silicon substrates 50 and 60 at the interface by an electric field.

Figure 7B:
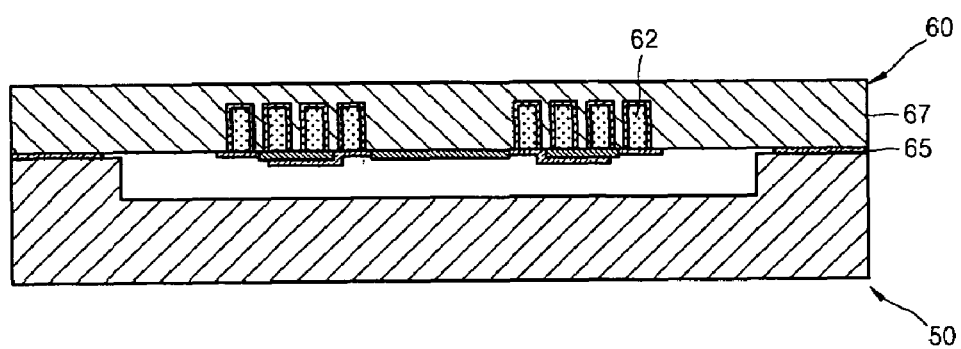

Referring to FIG. 7B, the front surface of the silicon substrate 60 is etched after the anodic bonding. That is, handle wafer 63 and oxidation layer 66 have been removed.

A wet etchant such as TMAH solution or KOH solution may be used as an etchant for etching the front surface of the silicon substrate 60. When an SOI substrate is used, the oxidation layer of the SOI may not be removed.

At this point, the thickness of the media stage can be determined by selecting the thickness of the device layer 67 of the SOI substrate. The elastic beam is the same thickness as the media stage, and affects the power consumption. When the elastic beam is thinner, the mass of the media stage and the stiffness of the elastic beams are reduced, to reduce the power consumption when the media stage is driven. When the substrate is not the SOI substrate having the oxidation layer, the thickness of the media stage can be determined according to an etching depth of the substrate. In this case, In order to minimize the power consumption, the etching depth may be adjusted within the range where the coil 62 is not exposed.

Figure 7C:
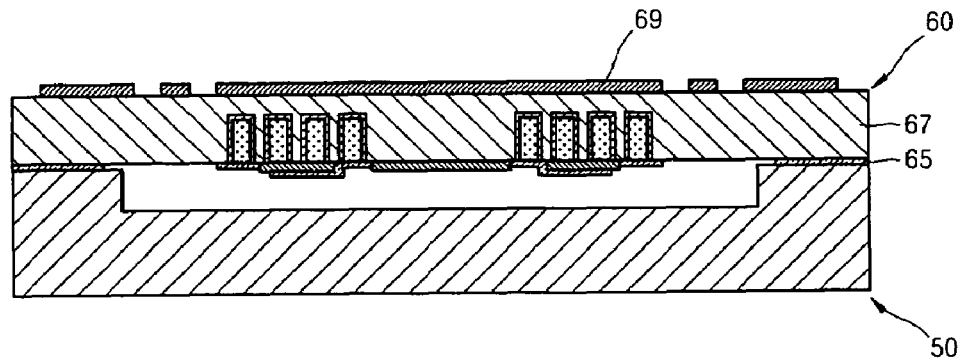
Figure 7D:
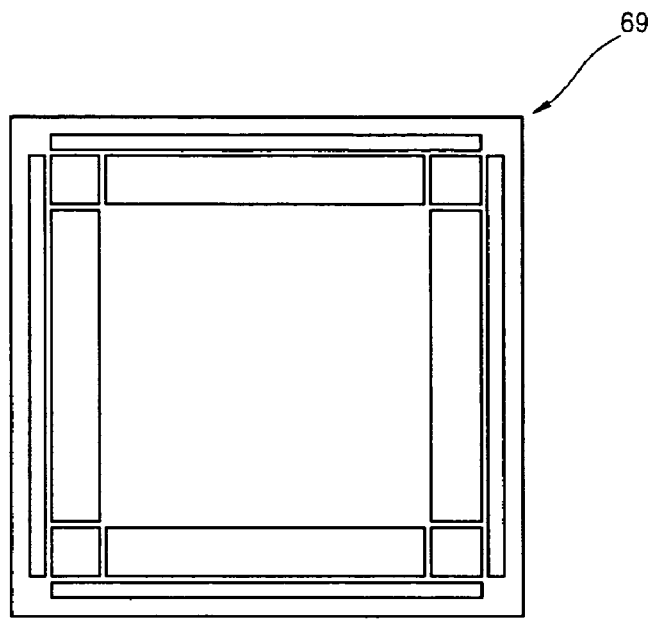
Figure 7E:
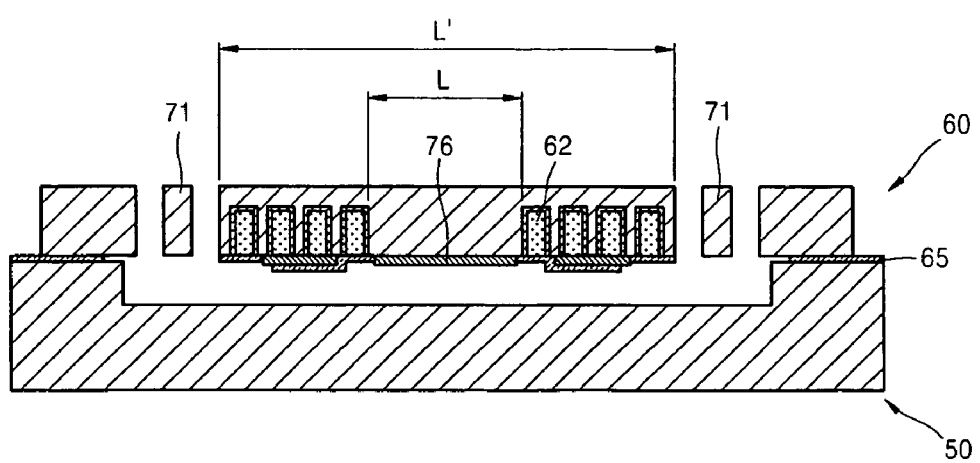

Referring to FIGS. 7C through 7E, the elastic beams (not shown) and the stiffeners 71 are formed such that the media stage can move in a predetermined direction, and the electrode pads 65 for applying the electric current are formed through an etching process. That is, an etching mask 69 is formed in response to the shapes and locations of the elastic beams, the stiffeners, and the electrode pads (see FIGS. 7C and 7D).

Then, the silicon substrate 60 is etched using the etching mask 69 as shown in FIG. 7E. The length of the media loading surface where the data storage medium can be loaded is not the distance between the coils 62 but is the overall length of the media stage, allowing a greater data storage capacity.

By the above-described actuator fabrication method, the coils for driving the media stage are formed on the bottom surface of the media stage.

According to a feature of the present invention, the front surface of the silicon substrate, on which the coils are formed, is bonded to the front surface of the glass substrate, on which the groove is formed, and the media loading surface is formed on the rear surface of the silicon substrate. Therefore, the present invention has at least the following advantages:

Since the coils are not exposed to the top surface of the media stage, the whole area of the media stage can be used as the media loading surface. Therefore, the area and data storage efficiencies can be improved.

The silicon substrate can be etched as deep as possible within the range where the coils are not exposed. As a result, the thickness of the media stage can be minimized to reduce the power consumption.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A method of fabricating a micro actuator comprising a media stage having a media loaded surface and a coil for driving the media stage, the coil being formed on the opposite surface of the media stage to the media loaded surface, the method comprising:
   forming one groove on a first surface of a first substrate;
   forming a trench having a shape of the coil on a first surface of a second substrate and filling the trench with metal to form the coil;
   bonding the first surface of the first substrate to the first surface of the second substrate; and
   forming the media loaded surface on a second surface of the second substrate, which is opposite the first surface of the second substrate
   wherein an area of the one groove is larger than an area occupied by the coil.

2. The method of claim 1, wherein the first surface of the first substrate and the first surface of the second substrate are bonded to each other such that the first surface of the first substrate and first surface of the second substrate contact each other.

3. The method of claim 1, wherein the first substrate is a glass substrate and the second substrate is a silicon substrate.

4. The method of claim 3, wherein the bonding of the first substrate to the second substrate is performed by anodic bonding.

5. A method of fabricating a micro actuator comprising a media stage having a media loaded surface and a coil for driving the media stage, the coil being formed on the opposite surface of the media stage to the media loaded surface, the method comprising:
   forming a groove on a first surface of a first substrate;
   forming the coil on a first surface of a second substrate;
   bonding the first surface of the first substrate to the first surface of the second substrate; and
   forming the media loaded surface on a second surface of the second substrate, which is opposite the first surface of the second substrate;
   wherein the forming of the coil comprises:
      forming a trench on the second substrate using ICP-RIE (inductively coupled plasma reactive ion etching);
      forming a passivation layer on the second substrate and the trench; filling the trench with metal; removing metal exposed above the trench by polishing.

6. The method of claim 5, wherein the filling of the trench is performed by electroplating.

7. The method of claim 5, wherein the forming of the groove comprises forming a first electrode on the first substrate; and
   the forming of the coil comprises forming a second electrode on the second substrate.

8. The method of claim 7, wherein the bonding of the first substrate to the second substrate is performed such that the first and second electrodes contact each other to form an electrode pad for applying an electric current.

9. The method of claim 8, wherein the forming of the media loaded surface comprises etching the second surface of the second substrate to a depth within a range where the coil formed on the second substrate is not exposed.

10. The method of claim 9, wherein the forming of the media loaded surface comprises etching the second surface of the second substrate to expose the electrode pad.

11. The method of claim 8, wherein the second substrate is an SOI (silicon-on-insulator) substrate having an oxidation layer.

12. The method of claim 11, wherein the forming of the media loaded surface comprises etching a second surface of the second substrate, which is opposite the first surface of the second substrate, to expose the oxidation layer; and etching the oxidation layer.

13. The method of claim 12, wherein the forming of the media loaded surface comprises etching the second surface of the second substrate to expose the electrode pad.

* * * * *